(12) United States Patent
Wang

(10) Patent No.: US 10,379,389 B2
(45) Date of Patent: Aug. 13, 2019

(54) DISPLAY DEVICE WITH ADJUSTABLE CURVATURE

(71) Applicant: AU Optronics Corporation, Hsin-Chu (TW)

(72) Inventor: Wei-Shyang Wang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/056,734

(22) Filed: Aug. 7, 2018

(65) Prior Publication Data

US 2019/0049759 A1    Feb. 14, 2019

(30) Foreign Application Priority Data

Aug. 11, 2017  (TW) .................................. 106127353

(51) Int. Cl.
| | |
|---|---|
| *H05K 5/00* | (2006.01) |
| *G02F 1/13* | (2006.01) |
| *G02F 1/1333* | (2006.01) |
| *H05K 5/02* | (2006.01) |
| *H01L 51/52* | (2006.01) |
| *H01L 51/00* | (2006.01) |

(52) U.S. Cl.
CPC ...... *G02F 1/1323* (2013.01); *G02F 1/133305* (2013.01); *G02F 1/133308* (2013.01); *H05K 5/0017* (2013.01); *H05K 5/0217* (2013.01); *G02F 2001/133314* (2013.01); *G02F 2201/58* (2013.01); *H01L 51/0097* (2013.01); *H01L 51/5237* (2013.01); *H01L 2251/5338* (2013.01)

(58) Field of Classification Search
CPC ............ G02F 1/1323; G02F 1/133305; H05K 5/0017; H05K 5/0217
See application file for complete search history.

(56) References Cited

U.S. PATENT DOCUMENTS

| | | | | |
|---|---|---|---|---|
| 6,091,474 A | * | 7/2000 | Middleton | .......... G02F 1/13452 |
| | | | | 349/149 |
| 8,459,061 B2 | | 6/2013 | Tetlow | |
| 8,553,207 B2 | | 10/2013 | Del Puerto | |

(Continued)

FOREIGN PATENT DOCUMENTS

| | | |
|---|---|---|
| CN | 102495482 A | 6/2012 |
| CN | 103344213 A | 10/2013 |

(Continued)

*Primary Examiner* — Hoa C Nguyen
*Assistant Examiner* — Keith DePew
(74) *Attorney, Agent, or Firm* — WPAT, PC

(57) ABSTRACT

The present invention provides a display device including a display panel, a first holder, and a second holder. The display panel includes a first side and a second side opposite to each other, and a display surface between the first side and the second side. The first holder is extended along the first side and holds the first side, and the second holder is extended along the second side and holds the second side. In the display device, the first holder and the second holder are capable of moving linearly relative to each other, so as to drive the first side and the second side to move relative to each other and force the display panel to bend. Further, the first holder and the second holder are capable of respectively driving the first side and the second side to rotate.

10 Claims, 9 Drawing Sheets

(56) References Cited

U.S. PATENT DOCUMENTS

| | | | |
|---|---|---|---|
| 8,958,026 B2 * | 2/2015 | Park | G02F 1/133305 |
| | | | 349/58 |
| 9,117,384 B2 | 8/2015 | Phillips et al. | |
| 9,274,560 B2 | 3/2016 | Ahn | |
| 9,413,284 B2 * | 8/2016 | Cho | H02K 7/00 |
| 9,521,770 B2 | 12/2016 | Li | |
| 9,552,778 B2 | 1/2017 | Lee | |
| 9,645,605 B2 * | 5/2017 | Park | H04N 5/64 |
| 9,736,951 B2 | 8/2017 | Cho et al. | |
| 9,804,734 B2 | 10/2017 | Arrasvuori et al. | |
| 9,952,706 B2 | 4/2018 | Cho et al. | |
| 9,978,293 B2 * | 5/2018 | Cho | H05K 5/0217 |
| 10,018,331 B2 * | 7/2018 | Chen | G02F 1/133 |
| 10,171,768 B2 * | 1/2019 | Rakshit | H04N 5/64 |
| 2013/0114193 A1 | 5/2013 | Joo et al. | |
| 2013/0207946 A1 * | 8/2013 | Kim | G09G 3/3225 |
| | | | 345/204 |
| 2013/0257775 A1 | 10/2013 | Lee | |
| 2014/0139657 A1 | 5/2014 | Chiu et al. | |
| 2015/0192952 A1 * | 7/2015 | Jung | G06F 1/1601 |
| | | | 361/747 |
| 2015/0277179 A1 * | 10/2015 | Nishi | G02B 6/0088 |
| | | | 349/58 |
| 2016/0249471 A1 * | 8/2016 | Li | G09F 9/30 |
| 2017/0265317 A1 | 9/2017 | Sun | |

FOREIGN PATENT DOCUMENTS

| | | | |
|---|---|---|---|
| CN | 103489380 A | | 1/2014 |
| CN | 103915041 A | * | 7/2014 |
| CN | 104143296 A | | 11/2014 |
| CN | 105044957 A | | 11/2015 |
| CN | 103915041 B | | 3/2016 |
| CN | 103854571 B | | 4/2016 |
| CN | 205194228 U | | 4/2016 |
| CN | 103559835 B | | 8/2016 |
| CN | 106157814 A | | 11/2016 |
| JP | 2856710 B2 | | 11/1998 |
| JP | 2009-222844 A | | 10/2009 |
| TW | I459811 B | | 11/2014 |
| TW | M497794 | | 3/2015 |
| TW | M497794 U | | 3/2015 |
| WO | WO2006/128594 A | | 12/2006 |

* cited by examiner

DISPLAY DEVICE WITH ADJUSTABLE CURVATURE

BACKGROUND

Technical Field

The present invention relates to a display device. More specifically, the present invention relates to a display device with an adjustable curvature.

Related Art

Nowadays, along with development and popularity of various electronic devices, demand for display panels is growing. Also, since electronic devices are developed to be lighter and thinner, more and more attention is paid to flexible display panels. Specifically, a flexible display panel capable of being bent is required to satisfy use demand in different environments. However, even if the display panel has flexibility and can be bent with a defined curvature, when a distance and an angle of a viewer relative to the display panel are changed, the display panel cannot display image with an optimum angle accordingly. For example, in the case that the flexibility is applied to a liquid crystal display panel, since the display effect of the liquid crystal display panel will be changed when a viewing angle is changed, the specific curvature designed for the liquid crystal display panel may not be the most suitable display curvature for the viewer.

In view of the above, it is necessary to develop a display panel of which a curvature can be adjusted according to the relative position and the angle of a viewer to obtain better display quality for improving viewing experience.

SUMMARY

Technical Means for Solving the Problem

To solve the foregoing problem, one embodiment of the present invention provides a display device including a display panel, a first holder, and a second holder. The display panel includes a first side and a second side that are opposite to each other and a display surface located between the first side and the second side. The first holder is extended along the first side and holds the first side, and the second holder is extended along the second side and holds the second side. In the display device, the first holder and the second holder can be moved linearly relative to each other, so as to drive the first side and the second side to move relative to each other and force the display panel to bend; the first holder and the second holder respectively drive the first side and the second side to rotate.

Technical Effects Achieved by the Technical Means Compared with the Prior Art

The display devices according to various embodiments of the present invention can adjust a curvature of a display panel by different extents of linear movement or rotation base on a position and an angle of a viewer. Therefore, an appropriate curvature can be provided for a viewer correspondingly. Furthermore, when a viewer does not view the display panel from a position relative to the center thereof, the display device according to the embodiment of the present invention can provide a more appropriate display effect for the viewer by differently adjusting the curvatures of the respective parts of the display panel.

DETAILED DESCRIPTION

Various embodiments will be described as follows, and a person of ordinary skill in the art can easily understand the spirit and principle of the present invention with reference to the accompanied drawings. However, although some specific embodiments are described herein, they are only exemplary, and do not mean limitation or exhaustion in any aspect. Therefore, a person of ordinary skill in the art can make various changes and amendments to the present invention apparently without departing from the spirit and principle of the present invention.

The display device according to one embodiment of the present invention will be described with reference to FIGS. 1 to 3.

Figure 1:
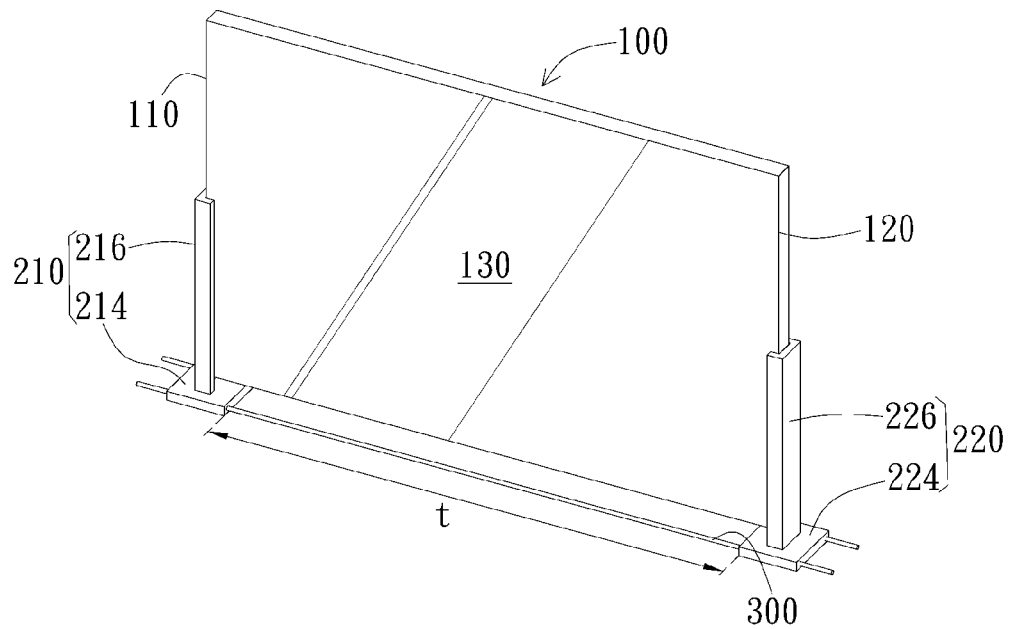
FIG. 1 is a schematic diagram of a display device according to one embodiment of the present invention.
Figure 2A:
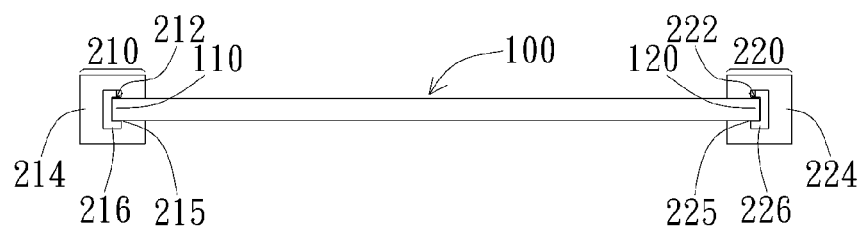
FIG. 2A is a top view diagram of a display device according to one embodiment of the present invention.

First, with reference to FIG. 1, the display device 10 includes a display panel 100, a first holder 210, and a second holder 220. The display panel 100 has a first side 110 and a second side 120 that are opposite to each other, and a display surface 130 between the first side 110 and the second side 120.

Herein, the display panel 100 can be a liquid crystal display panel, an organic light-emitting display panel, or any other panel with certain flexibility. According to one embodiment of the present invention, since the liquid crystal display panel has a feature of changing display effects as a viewing angle changes, the display panel 100 of the display device 10 can be applied to a liquid crystal display panel. However, the present invention is not limited thereby.

According to the embodiment shown in FIG. 1, the first holder 210 can be extended along the first side 110, and hold the first side 110, and the second holder 220 can be extended along the second side 120, and hold the second side 120. Therefore, the first holder 210 and the second holder 220 can be moved relative to each other collinearly to laterally press the first side 110 and the second side 120, thereby driving the whole display panel 100 to bend.

In specific, the first holder 210 and the second holder 220 can be disposed at two sides of the display panel 100 respectively, and extended along at least one portion of the first side 110 and the second side 120 of the display panel 100. For example, the first holder 210 and the second holder 220 can be respectively extended along a lower portion of the first side 110 and the second side 120. However, the foregoing disclosure is only exemplary, and according to another embodiment of the present invention, the first holder 210 and the second holder 220 can also be respectively extended along an upper portion of the first side 110 and the second side 120 of the display panel 100. Besides, the first holder 210 and the second holder 220 can also be extended respectively along a whole length of the first side 110 and the second side 120 of the display panel 100, or provided at specific pressure application points of the first side 110 and the second side 120 of the display panel 100. However, the present invention is not limited thereto. In the case that the first side 110 and the second side 120 can be pressed laterally and actuated when the first holder 210 and the second holder 220 are moved, the present invention can have various changes.

Furthermore, according to a preferred embodiment of the present invention, the first holder 210 and the second holder 220 can position and maintain the positions of the first side 110 and the second side 120 in a case that they are not fixed directly with the first side 110 and the second side 120. For example, with reference to FIG. 1 and FIG. 2A that is a top view diagram of FIG. 1, according to one embodiment of the present invention, the first holder 210 and the second holder 220 can respectively include a first notch 212 and a second notch 222. The first notch 212 and the second notch 222 respectively have a first opening 215 and a second opening 225 facing the display panel 100, and a width of the first opening 215 and the second opening 225 is larger than a thickness of the display panel 100. Therefore, the first side 110 and the second side 120 of the display panel 100 can be respectively placed in the first notch 212 and the second notch 222 through the first opening 215 and the second opening 225, such that the first side 110 and the second side 120 are respectively received in the first notch 212 and the second notch 222 at least partially. It should be noted that, for clarity and description convenience, FIG. 2A only shows the display panel 100, the first holder 210, and the second holder 220, and omits structures that are not related to the display panel 100, the first holder 210, and the second holder 220.

Figure 2B:
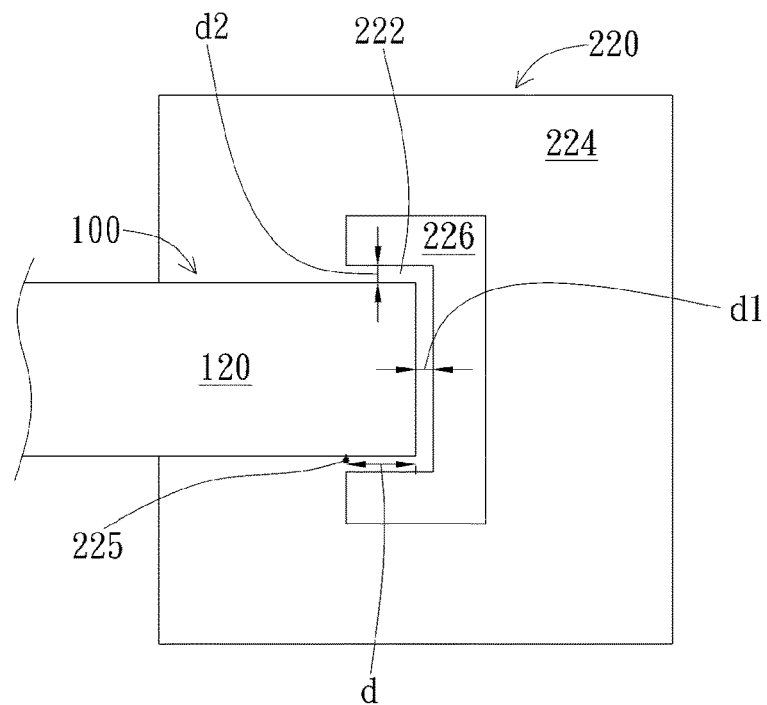
FIG. 2B is an enlarged schematic diagram of the second holder and the second side of the display device according to one embodiment of the present invention.

Next, the second holder 220 is taken as an example to describe possible structures of the first holder 210 and the second holder 220. With reference to FIG. 2B that is an enlarged schematic diagram of the second holder 220 and the second side 120 in FIG. 2A, when the second side 120 is received in the second notch 222 without being laterally pressed, the second side 120 and the second notch 222 are substantially configured in advance to have a gap d1 between the end of the second side 120 and the second lateral pressing portion 226 of the second holder 220 and gaps d2 between the two sides of the second side 120 and the second lateral pressing portion 226 of the second holder 220. Therefore, the second side 120 can be received in the second notch 222 by a length d. Herein, according to one embodiment of the present invention, in order to position and limit the second side 120 such that the second side 120 is not fixedly connected, the gap d1 can be 5-10 mm, the gaps d2 can be 5-20 mm, and the length d can be 10-30 mm. However, if only the first side 110 and the second side 120 can be positioned and limited in a case that the first side 110 and the second side 120 are not fixedly connected, the present invention is not limited to the example.

In view of the above, due to the limited space in the first notch 212 and the second notch 222, the first side 110 and the second side 120 of the display panel 100 can be positioned through the first holder 210 and the second holder 220 respectively. In such configuration, if the first holder 210 and the second holder 220 are moved relative to each other to reduce a distance therebetween, the first lateral pressing portion 216 and the second lateral pressing portion 226 of the first holder 210 and the second holder 220 can apply a pressure to drive the first side 110 and the second side 120 so as to make the whole display panel 100 bend. Since the first side 110 and the second side 120 are not fixed, when the pressure is applied to drive the first side 110 and the second side 120 so as to change the curvature of the whole display panel 100, the first side 110 and the second side 120 can be prevented from being blocked at a fixed position. Therefore, unnatural or inconsistent change of the curvature due to the blocking of the first side 110 and the second side 120 can be prevented. As a result, the consistency and the effect of the curvature change according to the embodiment of the present invention can be further improved.

Herein, the first side 110 and the second side 120 are shown to insert into the first notch 212 and the second notch 222 vertically. However, in order to make the display panel 100 bend in an expected form (for example, recessed or protruded) when the first lateral pressing portion 216 and the second lateral pressing portion 226 apply a pressure on the first side 110 and the second side 120, the first side 110 and the second side 120 can also be inserted and placed into the first notch 212 and the second notch 222 by forming an included angle with the first notch 212 and the second notch 222.

Figure 3:
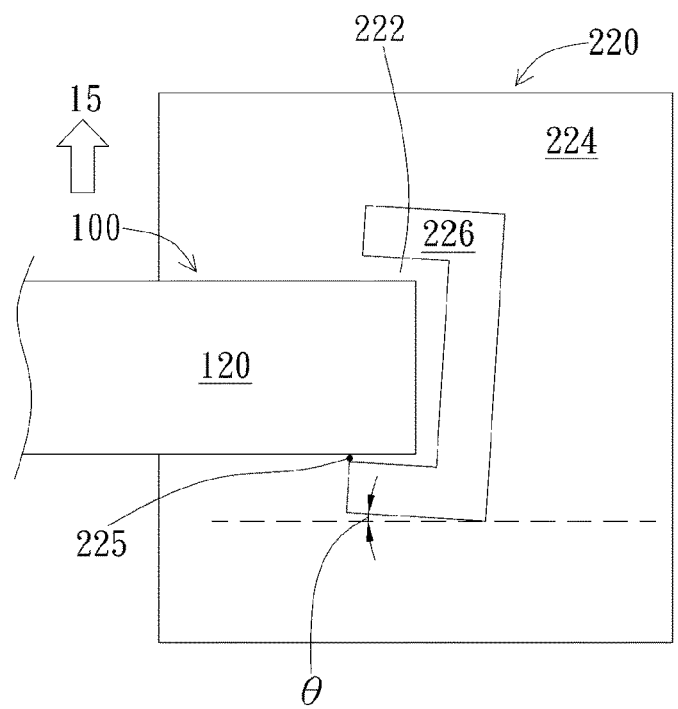
FIG. 3 is an enlarged schematic diagram of the second holder and the second side of the display device according to another embodiment of the present invention.

For example, with reference to FIG. 3 that is a corresponding modified embodiment of FIG. 2B, the first side 110 and the second side 120 can also form an included angle θ with the first notch 212 and the second notch 222 (the second side 120 and the second notch 222 are shown herein as an example). The angle θ can be an angle of 0-30 degrees. For example, when the first holder 210 and the second holder 220 are farthest away from each other relatively, the portion of the display panel 100 that is inserted into the second notch 222 (and/or the first notch 212) is inclined relative to the second opening 225 (and/or the first opening 215). The aforementioned aspect can be realized by rotating the first notch 212 and the second notch 222 by an angle θ relatively after the first side 110 and the second side 120 are vertically inserted into the first notch 212 and the second notch 222. However, the present invention is not limited thereby and can be realized by various manners.

In such a configuration, when the first holder 210 and the second holder 220 are farthest away from each other, the first holder 210 and the second holder 220 can contact or keep a gap with the display panel 100. When the first holder 210 and the second holder 220 contact with the display panel 100, the display panel 100 applied with the pressure can have an overall pre-bending radian according to the angle θ. On the contrast, when the first holder 210 and the second holder 220 keep a gap with the display panel 100, the display panel 100 can be presented as a plane. For example, according to one embodiment of the present invention, in a case that the first holder 210 and the second holder 220 are moved relatively on a guide rail 300 through a first base 214 and a second base 224, when the first base 214 is farthest away from the second holder 220 on the guide rail 300, the display panel 100 can have a pre-bending radian or can be presented as a plane.

With reference to FIG. 3, according to one embodiment in which the portions (for example, the first lateral pressing portion 216 and the second lateral pressing portion 226) of the holders are relatively rotated by the angle θ, when the first lateral pressing portion 216 and the second lateral pressing portion 226 apply a pressure on the first side 110 and the second side 120, the display panel 100 is expected to bend and recess toward a direction 15. That is, the display panel 100 is bent in a form of recessing toward the direction 15. In view of the above, a direction and an angle θ of pre-rotation can be determined correspondingly based on expected recessing or protruding forms of the display panel 100 according to the foregoing manner.

Under the precondition that the display effect and the curvature of the whole display panel 100 are not affected, the first side 110 and the second side 120 can be received in the first notch 212 and the second notch 222 in any form or angle to achieve a required bending direction, and the present invention is not limited to this embodiment.

In addition, the configuration that the first notch 212 and the second notch 222 position and maintain the first side 110 and the second side 120 in a case that the first notch 212 and the second notch 222 are not directly fixed with the first side 110 and the second side 120 is only an example, and other embodiments of the present invention can be provided to achieve the same or similar functions. Therefore, the present invention is not limited to this embodiment.

The following will describe linear movement and rotation of the first holder 210 and the second holder 220 in the display device 10 according to one embodiment of the present invention.

In specific, with reference to FIG. 1, according to one embodiment of the present invention, the display device 10 further includes a guide rail 300 that is extended along a direction of a connection line of the first side 110 and the second side 120. Furthermore, the first holder 210 includes a first base 214 and a first lateral pressing portion 216, the second holder 220 includes a second base 224 and a second lateral pressing portion 226, and the first holder 210 and the second holder 220 can be moved collinearly along the guide rail 300 through the first base 214 and the second base 224. Therefore, a distance t between the first holder 210 and the second holder 220 can be reduced or increased when the first holder 210 and the second holder 220 are moved along the guide rail 300.

Herein, for illustration convenience, the distance t can be defined as a distance between the first base 214 of the first holder 210 and the second base 224 of the second holder 220. However, in other implementation aspects, for example, in a case that the first holder 210 and the second holder 220 do not have the first base 214 and the second base 224, the distance t can also be defined as a distance between other components of the first holder 210 and the second holder 220, and the present invention is not limited thereby.

In view of the above, when the distance t is being reduced along with collinear movement, the first lateral pressing portion 216 and the second lateral pressing portion 226 laterally press to drive the first side 110 and the second side 120 respectively as described above. That is, the first holder 210 and the second holder 220 can be moved relative to each other linearly to apply a pressure to drive the first side 110 and the second side 120.

Figure 4A:
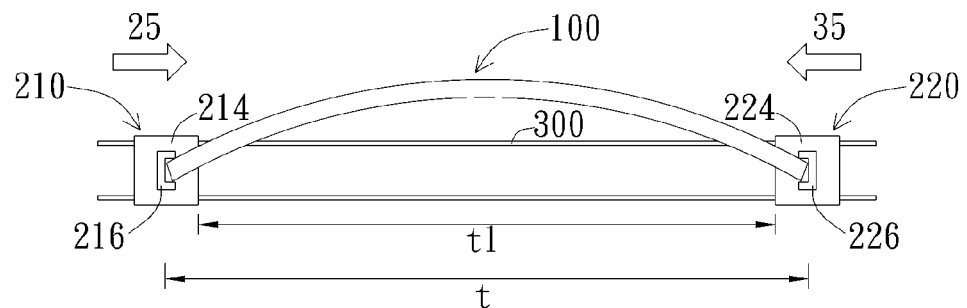
FIGS. 4A and 4B are schematic diagrams of adjusting a curvature of the display panel according to one embodiment of the present invention.
Figure 4B:
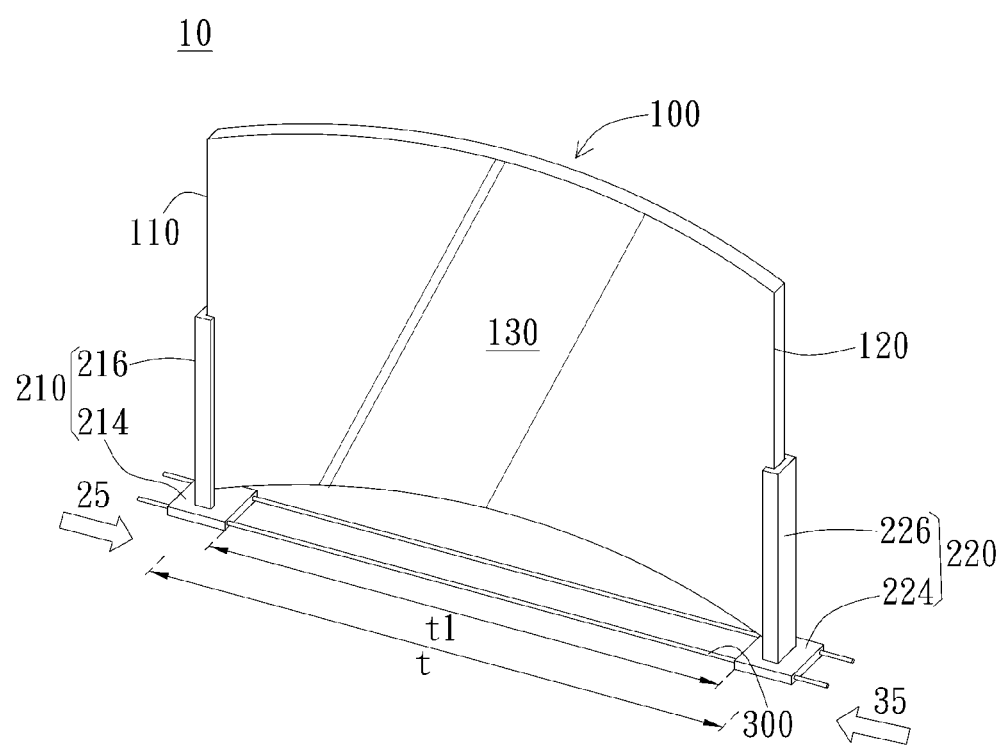

For example, with reference to FIGS. 1, 4A, and 4B, the first base 214 and the second base 224 can be moved along the guide rail 300, and when the distance t is reduced to the distance t1 as the first holder 210 and the second holder 220 are moved in the directions 25 and 35 respectively, the display panel 100 is folded and recessed accordingly, thereby changing the curvature of the display panel 100.

It should be noted that, the structure of the bases and the guide rail is only exemplary, and the first holder 210 and the second holder 220 can also be moved collinearly in a direction of a connection line of the first side 110 and the second side 120 through other manners and structures. Therefore, the present invention is not limited to the foregoing example.

Figure 5A:
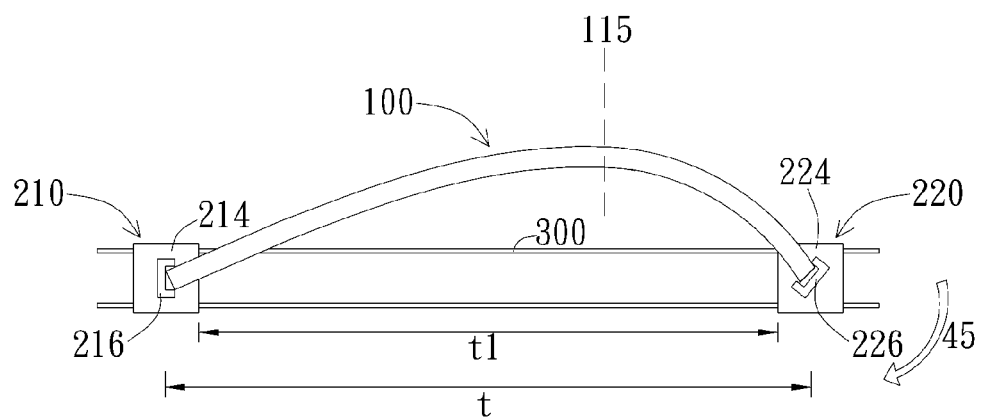
FIGS. 5A and 5B are schematic diagrams of adjusting a curvature of the display panel according to further another embodiment of the present invention.
Figure 5B:
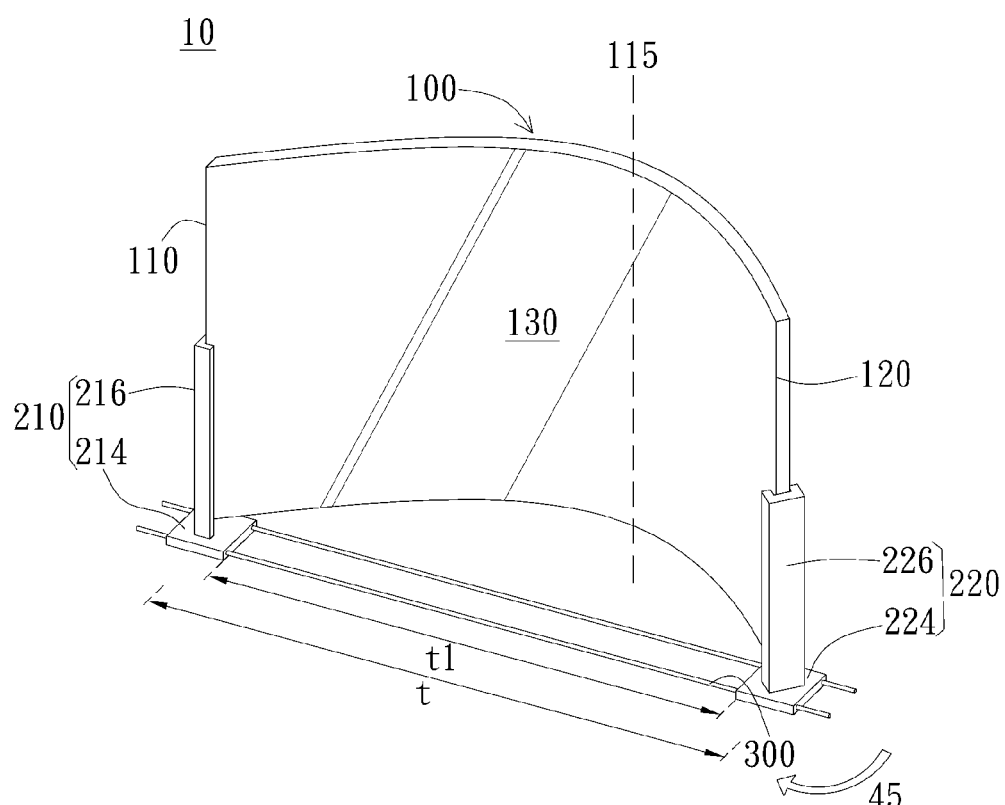

Next, with reference to FIGS. 1, 5A, and 5B, according to one embodiment of the present invention, the first holder 210 and the second holder 220 can not only be moved linearly relative to each other, but also respectively drive the first side 110 and the second side 120 to rotate. In detail, the first holder 210 and the second holder 220, for example, the first lateral pressing portion 216 and the second lateral pressing portion 226 of the first holder 210 and the second holder 220, can change the angles laterally pressing and pushing the first side 110 and the second side 120, thereby making the first side 110 and the second side 120 rotate relatively when the distance t1 is not changed. In view of the above, the curvature of the display panel 100 can be adjusted based on two independent latitudes of linear movement and relative rotation, thereby achieving more precise and differentiated curvature expressions for the display panel 100.

For example, the second lateral pressing portion 226 of the second holder 220 can be rotated in a direction 45, and then provide a torque for the display panel 100 at the second side 120. Herein, according to one embodiment of the present invention, the first lateral pressing portion 216 of the first holder 210 can be rotated by a small angle or even are not rotated, so that the second holder 220 might be rotated more than the first holder 210. In view of the above, through rotating the holders at the two sides by different angles, the display panel 100 exhibit different curvatures respectively at the portions adjoining the first side 110 and the second side 120. More specifically, on the display panel 100 separated by a separation line 115 perpendicular to the connection line of the first side 110 and the second side 120, the display panel 100 has a smaller curvature at the portion adjoining the first side 110 and has a larger curvature at the portion adjoining the second side 120. That is, the rotation angle of the first holder 210 can be smaller than the rotation angle of the second holder 220, and the second holder 220 that are rotated by a larger angle can form a larger curvature for the display panel 100 adjoining the second side 120. However, the present invention is not limited thereby, and for example, the first holder 210 can be rotated by a larger angle, and can form a larger curvature for the display panel 100 adjoining the first side 110.

Herein, according to the foregoing embodiment, although the first base 214 and the second base 224 are not rotated with the first lateral pressing portion 216 and the second lateral pressing portion 226, in another embodiment of the present invention, as long as the first base 214 and the second base 224 can be moved along the guide rail 300, the first base 214 and the second base 224 can also be rotated with the first lateral pressing portion 216 and the second lateral pressing portion 226, and the definition of the distance t can also be amended accordingly.

The relative linear movement or relative rotation can be driven by different drive mechanisms or devices respectively. For example, a motor, a pneumatic cylinder, and a belt reel can be used to drive the linear movement or relative rotation of the first holder 210 and/or the second holder 220. The foregoing disclosure is only exemplary, and the embodiments of the present invention are not limited thereby.

Furthermore, in the foregoing embodiment, the first holder 210 and the second holder 220 are moved linearly first, and then are rotated relatively by a torque. However, the present invention is not limited thereby, and other implementation aspects according to other embodiments may be provided. For example, the first holder 210 and the second holder 220 can also be rotated relatively first and then are moved linearly relative to each other, or can be rotated relatively and moved linearly relative to each other at the same time. In addition, a single holder/two holders can be moved linearly or rotated relatively at the same time or in an alternate manner or in other manners, and the present invention is not limited thereby.

The following will further describe an aspect of using a detection device to detect a user position so as to adjust a curvature of the display panel according to a modified embodiment of the present invention.

Figure 6:
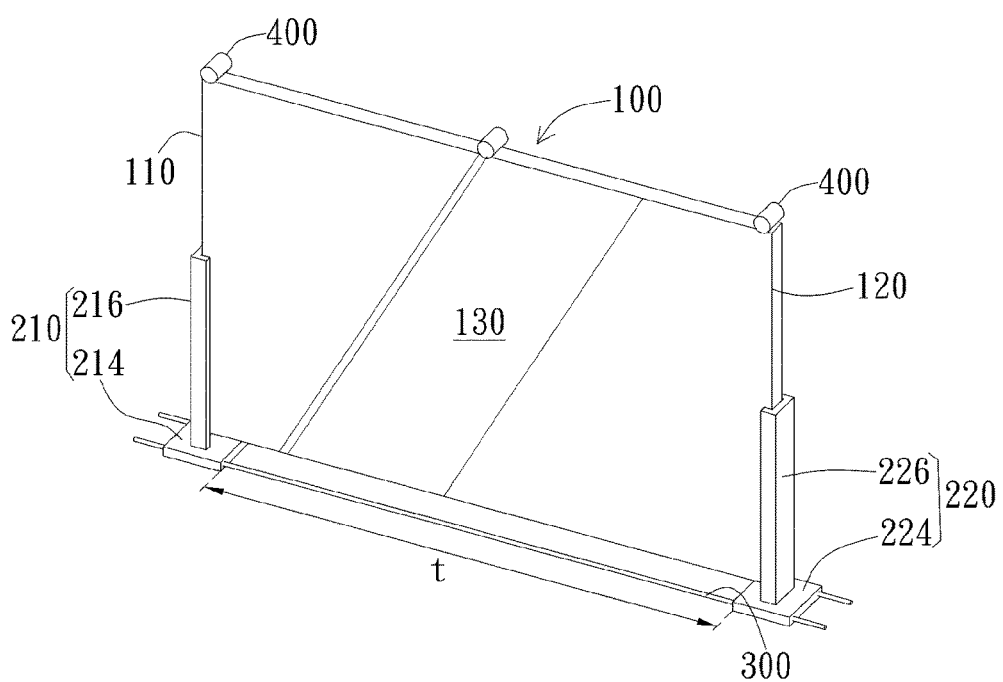
FIG. 6 is a schematic diagram of the display device according to still further another embodiment of the present invention.

In view of the above, with reference to FIG. 6, the display device 20 according to the modified embodiment of the present invention and the display device 10 with reference to FIG. 1 substantially have the same or similar structure and are different in that the display device 20 further includes one or more detection devices 400 for detecting a user position. For example, the detection device 400 can be disposed on the display panel 100, and is a device for detecting a position and an angle of a user by using a facial recognition system. However, the foregoing disclosure is only exemplary, and the detection device 400 can be any device capable of detecting a position and an angle of a user, and the device, the form, and the configuration or position are not limited to the embodiment specifically described herein.

As described in other embodiments, the display panel 100 can be controlled to be recessed or protruded by adjusting an angle. According to a preferred embodiment, when a user faces the display surface and the detection device 400 detects the user, a curvature of the display panel 100 can be adjusted to make the display surface 130 recess relative to the position of the user. Therefore, the user may be provided with better viewing and immersive effects.

Figure 7A:
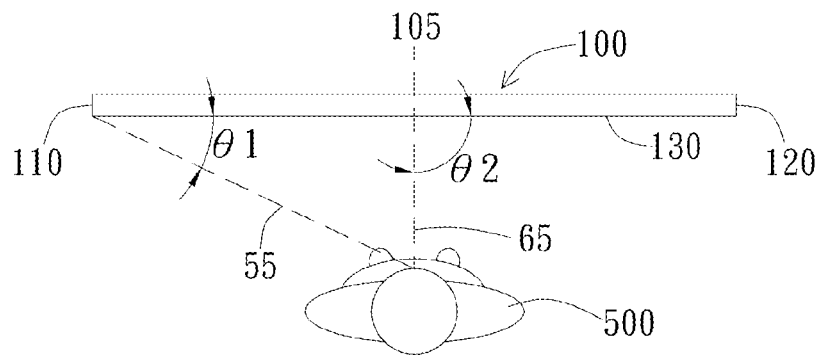
FIGS. 7A and 7B are schematic diagrams of adjusting a curvature of the display panel based on a user position according to one modified embodiment of the present invention.
Figure 7B:
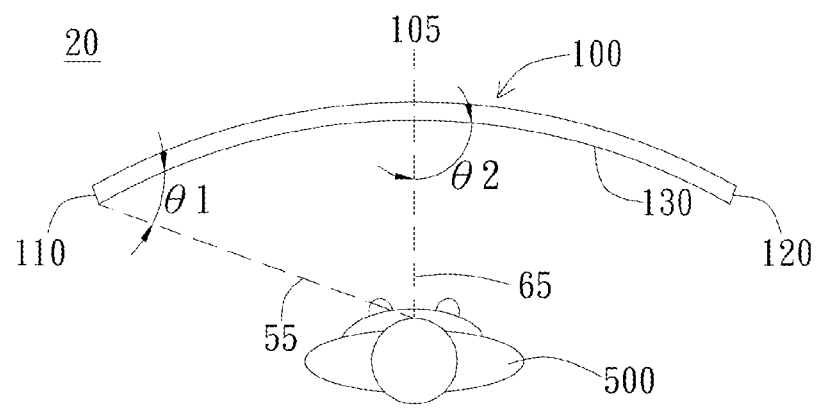

For example, with reference to FIGS. 7A and 7B, the following will describe a status of adjusting the curvature of the display panel 100 based on a user position according to a modified embodiment of the present invention. Specifically, in FIGS. 7A and 7B, similar to FIGS. 1 to 6, the detection device 400 can be used to detect a position and an angle of a user 500, and the curvature of the display panel 100 is adjusted by linearly moving or rotating the first holder 210 and the second holder 220 correspondingly. Therefore, for brevity's sake and description convenience, the relative positions and curvature relationship of the user 500 and the display panel 100 are mainly shown herein, and the other structures of detection, movement, and rotation are omitted.

With reference to FIG. 7A, according to a modified embodiment of the present invention, when a user 500 views a display surface 130 of a display panel 100 of a display device 20, the position of the user 500 can be detected by using a detection device. Therefore, an included angle between a possible sight line of the user 500 pointing to the display surface 130 at different positions of the display panel 100 and the display panel 130 can be deduced accordingly. For example, when the user 500 is separated from the display panel 100 and located at a position with respect to the center 105 of the display panel 100, an included angle between a possible sight line 55 of the user 500 toward the first side 110 (or the second side 120) of the display surface 130 and the display surface 130 is $\theta_1$, and an included angle between a possible sight line 65 of the user 500 toward the center 105 of the display surface 130 and the display surface 130 is $\theta_2$.

In view of the above, when the initial display panel 100 is a plane or has a minimum curvature, since the angle $\theta_1$ is not equal to the angle $\theta_2$, the user 500 may possibly feel different viewing effects from the center 105 and the first side 110 (or the second side 120), and even may feel that the relative image size, color and angle at different positions are differentiated. Therefore, since the display effects displayed at different positions of the display surface 130 are inconsistent, the viewing experience of the user 500 may be degraded.

Next, with reference to FIG. 7B, according to one embodiment of the present invention, preferably as described in FIGS. 1-5B, the first holder and the second holder are linearly moved with respect to each other and are rotated relatively to adjust the curvature of the whole display panel 100, so that the display of the overall display surface 130 with respect to the possible sight lines of the user 500 can present consistent viewing effects. That is, the included angles (visual angles) between the possible sight lines of the user 500 and the display surface 130 on the whole display panel 100 are kept to be consistent as far as possible. For example, the included angle $\theta_1$ at the first side 110 (or the second side 120) and the included angle $\theta_2$ at the center 105 are consistent or similar. However, the foregoing disclosure is only exemplary, and the present invention is not limited thereby. For example, the angles $\theta_1$ and $\theta_2$ may also be set manually to have a certain proportion, and the display device 20 can detect and adjust the curvature of the display panel 100 according to the setting.

Figure 8A:
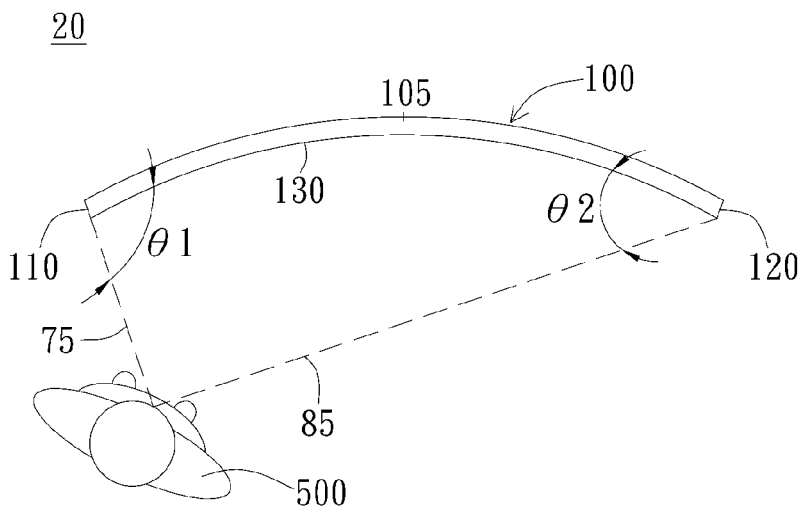
FIGS. 8A and 8B are schematic diagrams of adjusting a curvature of the display panel based on a user position according to another modified embodiment of the present invention.
Figure 8B:
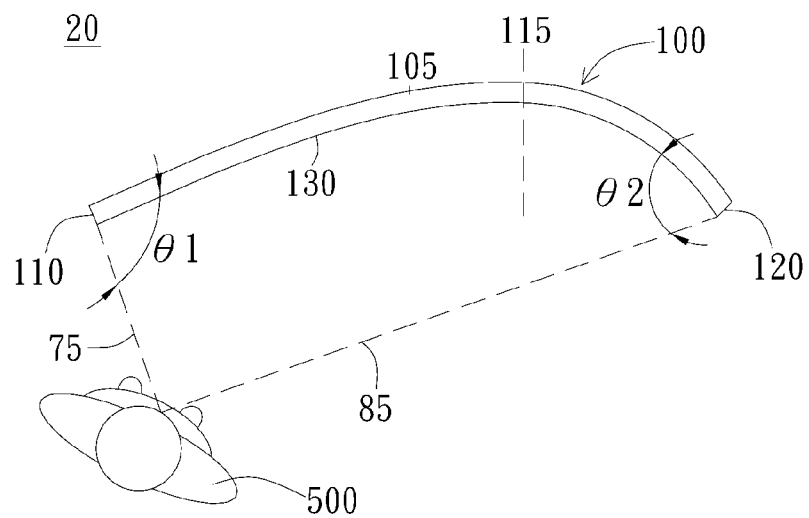

The following will describe an embodiment of adjusting the curvature of the display panel 100 in a case that the user 500 is separated from the display panel 100 and is located at a position relatively deviates from the center 105 of the display panel 100 with reference to FIGS. 8A and 8B.

With reference to FIG. 8A, when the whole display panel 100 is adjusted averagely to have a single and consistent curvature as indicated in FIG. 7B, since the user 500 relatively deviates from the center 105 of the display panel 100 in FIG. 8A, the included angles (visual angles) between the possible sight lines of the user 500 and the display surface 130 along the whole display panel 100 are not equal. For example, an included angle between a possible sight line 75 of the user 500 toward a position of the display surface 130 near the first side 110 and the display surface 130 is $\theta_1$, and an included angle between a possible sight line 85 of the user 500 toward a position of the display surface 130 near the second side 120 and the display surface 130 is $\theta_2$, and the angles $\theta_1$ and $\theta_2$ may not be equal or in an expected proportion even after the curvature of the display panel 100 is adjusted averagely. Therefore, it is difficult to display images on the display panel 100 uniformly for the user 500.

To resolve the foregoing problem, with reference to FIG. 8B, the degrees of the relative rotation of the first holder and the second holder can be adjusted unequally in a similar manner as illustrated in FIGS. 5A and 5B, so that the display panel 100 has different curvatures at the two sides separated by the separation line 115. For example, according to the embodiment shown in FIGS. 8A and 8B, when the position of the user 500 is near the first side 110 relative to the center 105, the second holder is rotated relatively for a larger angle, so that the portion of the display surface 130 near the first side 110 has a smaller curvature, and the portion near the second side 120 has a larger curvature. On the contrary, when the position of the user 500 is near the second side 120 relative to the center 105, the display surface 130 can be adjusted so that the portion near the second side 120 has a smaller curvature. Therefore, the included angles $\theta_1$ and $\theta_2$ respectively near the first side 110 and the second side 120 can be made to be consistent or similar, so as to uniformly display the image in a preferred angle.

According to a preferred embodiment, after the curvature of the display panel 100 is adjusted according to a position and an angle of the user 500 as stated with reference to FIGS. 7A-8B, a first normal line and a second normal line respectively defined at the respective positions of the display surface 130 adjacent to the first side 110 and the second side 120 can respectively point to the position of the user 500. That is, the first normal line and the second normal line are preferably parallel and equal to the possible sight lines of the user 500 viewing the display surface 130 at respective positions. At this time, the angles $\theta_1$ and $\theta_2$ can be 90 degrees. However, the present invention is not limited thereby, and the angles $\theta_1$ and $\theta_2$ can be any other degrees except 90 degrees.

Figure 9A:
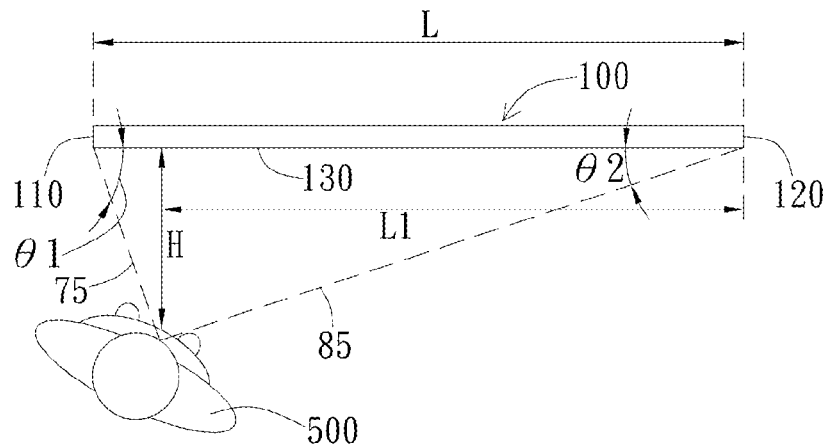
FIGS. 9A and 9B are schematic diagrams of deducing and adjusting a curvature of the display panel based on a user position according to yet another modified embodiment of the present invention.
Figure 9B:
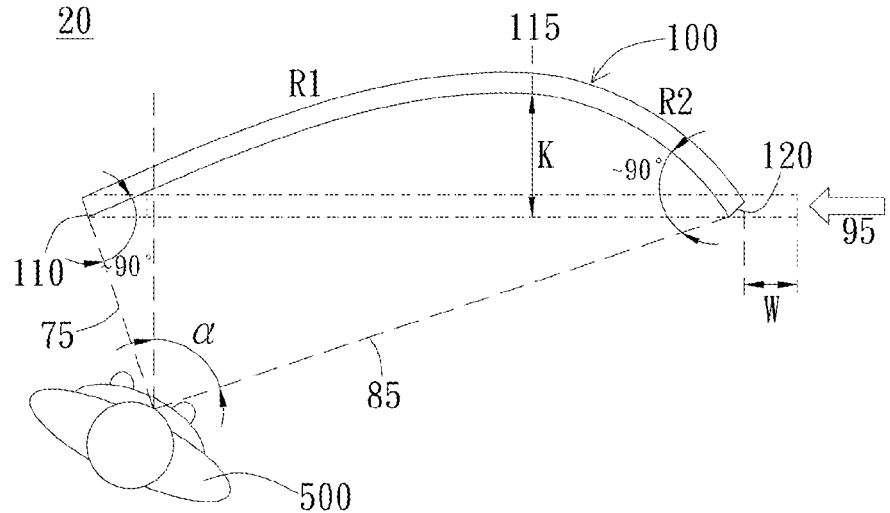

In view of the above, according to one embodiment of the present invention, when an included angle (visual angle) between a possible sight line of the user 500 viewing the display surface 130 and the display surface 130 is expected or preset to be 90 degrees, the extents of linear movement and relative rotation of the first holder and the second holder can be deduced according to formulas 1-3 with reference to FIGS. 9A and 9B.

$$K = L \cdot \sin[(90-\theta_1)/2] \cdot \cos(\alpha/2)/[\sin(\alpha/2)+\sin[(90-\theta_1)/2]] \quad \text{Formula 1:}$$

$$W = L \cdot \{\sin(\alpha/2)+\sin[(90-\theta_1)/2] \cdot [1-\cos(\alpha/2)-\sin(\alpha/2) \cdot \cot[(90-\theta_1)/2]\}/\{\sin(\alpha/2)+\sin[(90-\theta_1)/2]\} \quad \text{Formula 2:}$$

$$\tan \alpha = (L-W)/(L_1 \cdot \tan \theta_2) \quad \text{Formula 3:}$$

With reference to FIGS. 9A and 9B that are schematic diagrams corresponding to actions of the foregoing embodiments, in formulas 1-3, L is a total length of the display panel 100; H is a shortest distance between a sight line source of the user 500 and the display panel 100; $L_1$ is a length of the display panel 100 along a longer part of the two parts of the display panel 100 separated by the base point for the measurement of the distance H; as defined above, the angles $\theta_1$ and $\theta_2$ are respectively an included angle between a possible sight line of the user 500 toward a position of the display panel 100 near the first side 110 and the display panel 100 and an included angle between a possible sight line of the user 500 toward a position of the display panel 100 near the second side 120 and the display panel 100; K is a maximum distance along the separation line 115 between the adjusted display panel 100 and a connection line of the first side 110 and the second side 120 (in this embodiment, it is the case that the included angle between a possible sight line of the user 500 toward a position of the display panel 100 near the first side 110 and the display panel 100, and the included angle between a possible sight line of the user 500 toward a position of the display panel 100 near the second side 120 and the display panel 100 are expected to be equal to or similar to 90 degrees); W is the linear movement distance of the first holder and the second holder alone or together (for example, the reduced distance of the second holder along the direction 95); and $\alpha$ is an included angle between a normal line perpendicular to a connection line of the first side 110 and the second side 120 and a sight line of the user 500 pointing to the side with a larger curvature (herein, the second side 120). Regarding the adjusted display panel 100 separated by the separation line 115 perpendicular to the connection line of the first side 110 and the second side 120, the portion near the first side 110 has a curvature $R_1$, and the portion near the second side 120 has a curvature $R_2$.

In view of the above, when the visual angle after the display panel 100 is adjusted is expected to be 90 degrees, the extents of the linear movement and the relative rotation of the first holder and the second holder can be deduced according to the formulas 1-3. In specific, the angle $\alpha$, the linear movement distance W, the distance K, and the curvatures $R_1$ and $R_2$ can be deduced according to the formulas 1-3. If the linear movement distance W cannot satisfy the required curvature, the angle by which the first holder and/or the second holder should additionally be rotated is further deduced, and then the first holder and/or the second holder are rotated in accordance with the deduced angle. However, the present invention is not limited thereby. When the visual angle after the display panel 100 is adjusted is expected to be another angle, or other various changes and settings are required, the formulas 1-3 can be adjusted correspondingly. Accordingly, the display panel 100 is adjusted according to the detection result of the detection device 400 to provide different curvatures.

Therefore, according to the modified embodiment of the present invention, the display panel 100 can be further adjusted based on the position and the angle of the user 500, and the display panel 100 can bent differently according to different curvatures along the entire display panel 100, so as to display the image for the user 500 in a preferred angle at desirable portions.

According to further another modified embodiment of the present invention, a rear panel 1000 can be further used to support the display panel 100. For example, when the display device 10 and/or the display device 20 is applied to a large display device such as an LCD TV, the rear panel 1000 can be disposed on the rear side of the display panel 100 to support the display panel 100 relatively when the display panel 100 is bent.

Herein, the rear panel 1000 can be preferably made of a rigid material, for example, a metal. However, the present invention is not limited thereby, and the rear panel 1000 can be made of any material within the scope of the present invention.

Figure 10A:
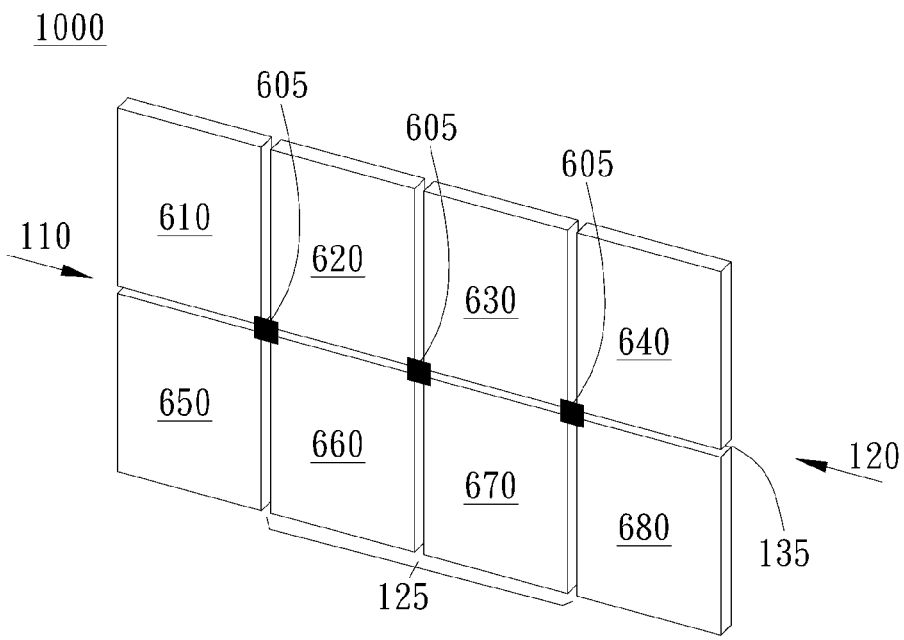
FIGS. 10A and 10B are schematic diagrams of a rear panel for supporting the display panel according to still another modified embodiment of the present invention.
Figure 10B:
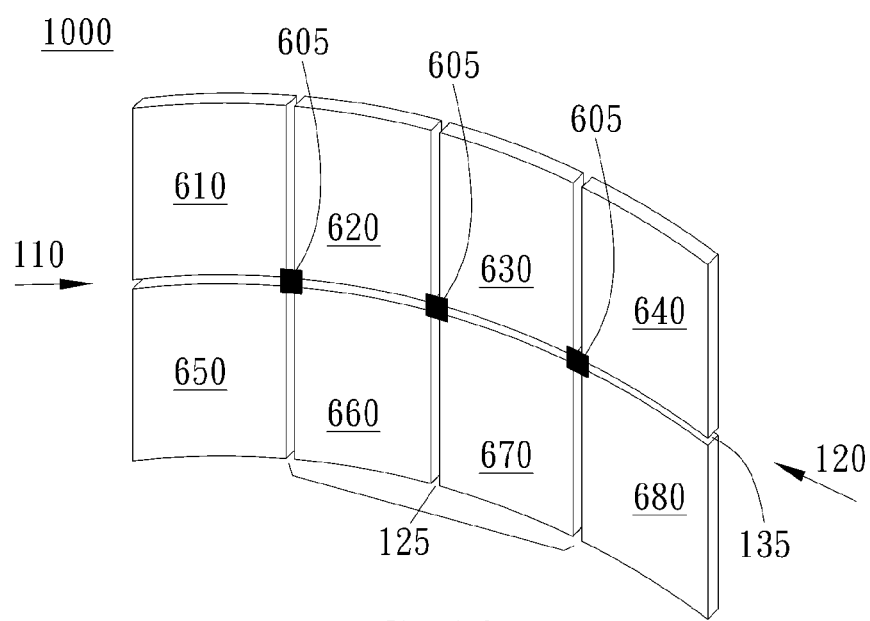

With reference to FIGS. 10A and 10B that respectively show the planar and bending statuses of the rear panel 1000 according to one embodiment of the present invention, the rear panel 1000 is substantially formed of multiple blocks 610-680 connected at connection positions 605. In specific, the rear panel 1000 is disposed on the rear side of the display panel 100, and the rear panel 1000 has a plurality of first trenches 125 respectively parallel to the first side 110 and the second side 120 of the display panel 100. In addition, the rear panel 1000 can also have at least one second trench 135, and the second trench 135 and the first trenches 125 can be intersected with each other, so as to divide the rear panel 1000 into a plurality of blocks 610-680.

In view of the above, the multiple blocks 610-680 are connected at the connection positions 605, so as to ensure the integrity of the rear panel 1000 while maintaining the ability of the rigid rear panel 1000 to be bent when the display panel 100 is bent. Therefore, the bent display panel 100 can be supported more stably by using the rear panel 1000.

It should be noted that, the quantity and distribution of the blocks of the rear panel 1000 as illustrated are only exemplary, and for the rear panel in other embodiments of the present invention, any quantity and configuration within the scope of the present invention are allowed. Furthermore, although more first trenches 125 are provided herein, according to other embodiments of the present invention, when the first holder and the second holder of the display panel 100 are moved up and down linearly, the quantity of the second trenches 135 can also be larger than that of the first trenches 125, and the present invention is not limited thereby. For example, the display device according to another embodiment of the present invention can also include a first holder and a second holder that are moved left and right linearly, and additionally include a third holder and a fourth holder that are moved up and down linearly. In such embodiment, the quantities of the first trenches 125 and the second trenches 135 can be adjusted correspondingly according to the supportability and flexibility.

As stated above, according to the full text, it can be understood that, the display device according to the embodiments of the present invention have a function of moving linearly to laterally press the two sides of the display panel to adjust the curvature of the whole display panel correspondingly. Therefore, the corresponding display angle, the immersive effect, and the display image of the display panel when viewing can be adjusted, thereby improving the viewing experience and quality of the display device for a user.

Some preferred embodiments of the present invention are described above. It should be noted that, various variations and modifications can be made to the present invention without departing from the spirit and principle of the present invention. A person of ordinary skill in the art should understand that, the present invention is defined by the claims, and when the intention of the present invention is satisfied, various replacements, combinations, modifications, and transformations do not go beyond the scope of the present invention as defined by the claims.

What is claimed is:

1. A display device, comprising:
   a display panel including a first side and a second side that are opposite to each other and a display surface located between the first side and the second side;
   a first holder extended along the first side and holding the first side; and
   a second holder extended along the second side and holding the second side;
   wherein the first holder and the second holder are capable of moving linearly relative to each other, so as to drive the first side and the second side to move relative to each other and force the display panel to bend, and the first holder and the second holder respectively drive the first side and the second side to rotate relatively,
   wherein the first holder has a first notch, the first notch has a first opening facing the display panel, and the first side is at least partially received in the first notch, and when the first holder is farthest away from the second holder relatively, a portion of the display panel inserted into the first notch is inclined with respect to the first opening.

2. The display device according to claim 1, further comprising a detection device configured to detect a user position, wherein the display surface is adjusted to be recessed or protruded relative to the user position.

3. The display device according to claim 2, wherein a first normal line and a second normal line are defined with respect to the display surface respectively at a position adjacent to the first side and a position adjacent to the second side, and the first normal line and the second normal line respectively point to the user position.

4. The display device according to claim 2, wherein when the user position is relatively close to the first side among the first side and the second side, a portion of the display surface close to the first side has a smaller curvature.

5. The display device according to claim 4, wherein a rotation angle of the first holder is smaller than a rotation angle of the second holder.

6. The display device according to claim 1, further comprising a guide rail extended in a direction of a connection line of the first side and the second side; wherein the first holder has a first base, and the first base is capable of moving along the guide rail.

7. The display device according to claim 6, wherein when the first base is farthest away from the second holder in the guide rail, the display panel has a pre-bending radian.

8. The display device according to claim 1, wherein the display panel has a thickness, and a width of the first opening is larger than the thickness.

9. The display device according to claim 1, further comprising a rear panel provided on a rear side of the display panel, wherein the rear panel has a plurality of first trenches, and the first trenches are parallel to the first side and the second side respectively.

10. The display device according to claim 9, wherein the rear panel has at least one second trench, and the second trench and the first trenches are intersected with each other.

* * * * *